(12) United States Patent
Wang (10) Patent No.: US 9,897,392 B2
(45) Date of Patent: Feb. 20, 2018

(54) HEAT CONDUCTION DEVICE AND MANUFACTURING METHOD THEREOF

(71) Applicant: Yeh-Chiang Technology Corp., Taipei (TW)

(72) Inventor: Tai-Kuang Wang, Taipei (TW)

(73) Assignee: YEH-CHIANG TECHNOLOGY CORP., Taipei (TW)

( * ) Notice: Subject to any disclaimer, the term of this patent is extended or adjusted under 35 U.S.C. 154(b) by 25 days.

(21) Appl. No.: 15/157,391

(22) Filed: May 17, 2016

(65) Prior Publication Data

US 2017/0227297 A1 Aug. 10, 2017

(30) Foreign Application Priority Data

Feb. 5, 2016 (TW) .............................. 105104120 A (51) Int. Cl.
*F28D 15/00* (2006.01)
*F28D 15/04* (2006.01)
*B23P 15/26* (2006.01)

(52) U.S. Cl.
CPC .............. *F28D 15/04* (2013.01); *B23P 15/26* (2013.01); *B23P 2700/09* (2013.01); *F28F 2255/00* (2013.01)

(58) Field of Classification Search
CPC .. F28D 15/0233; F28D 15/043; F28D 15/046; F28D 15/04; B23P 15/26; B23P 2700/09
USPC .................................................... 165/104.26
See application file for complete search history.

(56) References Cited

U.S. PATENT DOCUMENTS

| 6,382,309 | B1* | 5/2002 | Kroliczek | ............ F28D 15/0233 165/104.26 |
| 2002/0050341 | A1* | 5/2002 | Dussinger | ............ F28D 15/0233 165/104.26 |
| 2005/0230085 | A1* | 10/2005 | Valenzuela | ............ F28D 15/043 165/104.26 |
| 2010/0084113 | A1* | 4/2010 | Lee | ........................ F28D 15/046 165/46 |

FOREIGN PATENT DOCUMENTS

| CN | 202221259 U | 5/2012 |
| CN | 104976910 A | 10/2015 |
| TW | M381775 U1 | 6/2010 |
| TW | M406729 U1 | 7/2011 |

OTHER PUBLICATIONS

Taiwanese Office Action dated Jan. 10, 2017.

* cited by examiner

*Primary Examiner* — Davis Hwu
(74) *Attorney, Agent, or Firm* — Rabin & Berdo, P.C.

(57) ABSTRACT

A heat conduction device and a manufacturing method thereof are provided. The heat conduction device includes a first plate, a second plate and a capillary structure. The first plate is connected opposite to the second plate. The capillary structure is formed on space between the first plate and the second plate. A vapor channel is formed on a region of the space outside the capillary structure.

16 Claims, 12 Drawing Sheets

HEAT CONDUCTION DEVICE AND MANUFACTURING METHOD THEREOF

This application claims the benefit of Taiwan application Serial No. 105104120, filed Feb. 5, 2016, the disclosure of which is incorporated by reference herein in its entirety.

TECHNICAL FIELD

The disclosure relates in general to a heat conduction device and a manufacturing method thereof, and more particularly to a flat plate-shaped heat conduction device and a manufacturing method thereof.

BACKGROUND

A manufacturing method of a conventional heat pipe includes the following steps. Firstly, a circular pipe whose periphery is closed. Then, a powder metallurgy layer is formed within the circular pipe by way of powder metallurgy technology. Then, openings of two terminals of the circular pipe are closed. Finally, the circular pipe is staved.

However, such manufacturing method is complicated. The interior structure of the circular pipe can't be inspected during manufacturing, and it is possible to break the interior structure of the circular pipe due to the stave process.

Therefore, it has become a prominent task for the industry to resolve the above problems.

SUMMARY

According to one embodiment, a heat conduction device is provided. The heat conduction device includes a first plate, a second plate and a capillary structure. The second plate is connected opposite to the first plate. The capillary structure is formed on space between the first plate and the second plate. A vapor channel is formed on a region of the space outside the capillary structure.

According to another embodiment, a manufacturing method of a heat conduction device and is provided. The manufacturing method includes the following steps. A first plate is provided; a second plate is provided; a capillary structure is formed on at least one of the first plate and the second plate; the first plate is connected to the second plate, wherein the capillary structure is formed on space between the first plate and the second plate, and a vapor channel is formed on a region of the space outside the capillary structure.

The above and other aspects of the invention will become better understood with regard to the following detailed description of the preferred but non-limiting embodiment (s). The following description is made with reference to the accompanying drawings.

DETAILED DESCRIPTION

Figure 1A:
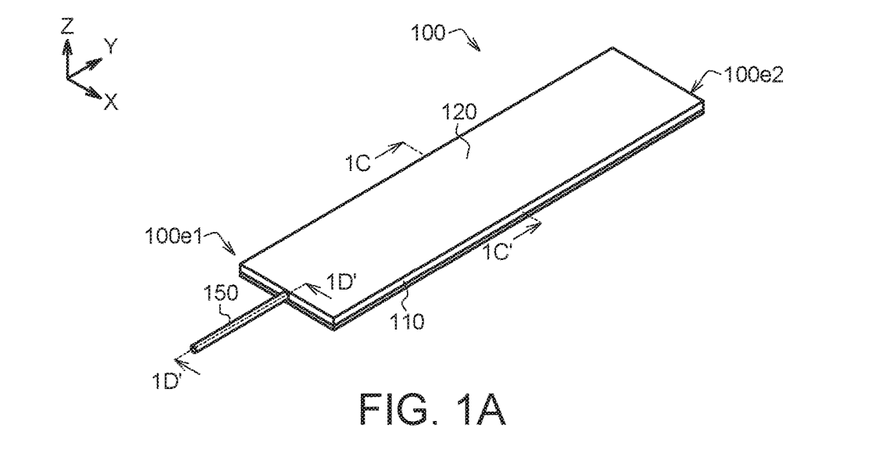
FIG. 1A illustrates an appearance view of a heat conduction device according to an embodiment of the invention.
Figure 1B:
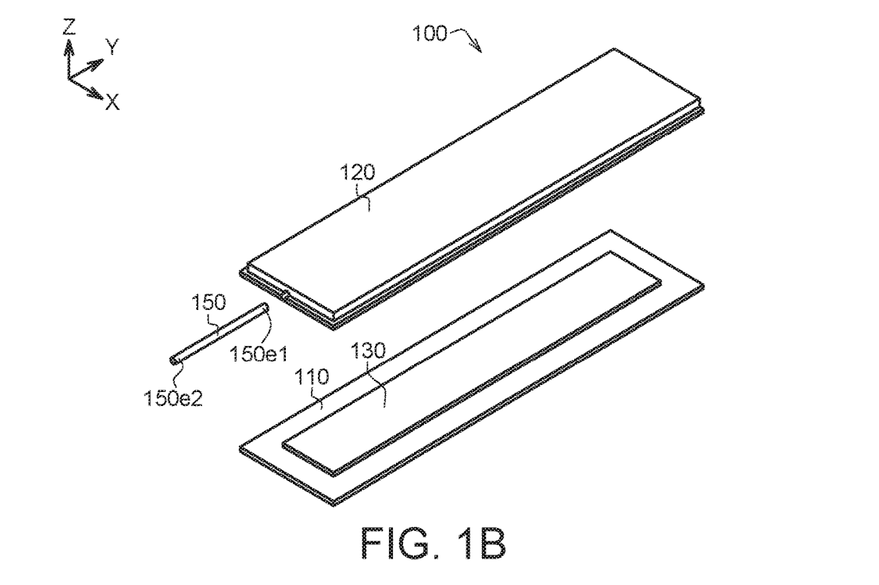
FIG. 1B illustrates an exploded view of the heat conduction device of FIG. 1A.
Figure 1C:
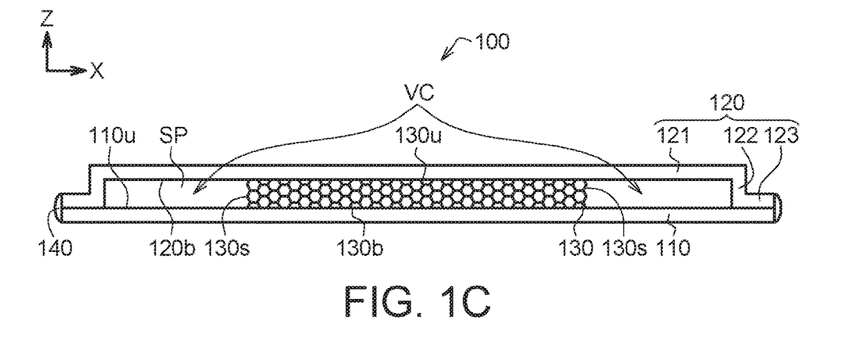
FIG. 1C illustrates a cross sectional view of the heat conduction device along a direction 1C-1C' of FIG. 1A.
Figure 1D:
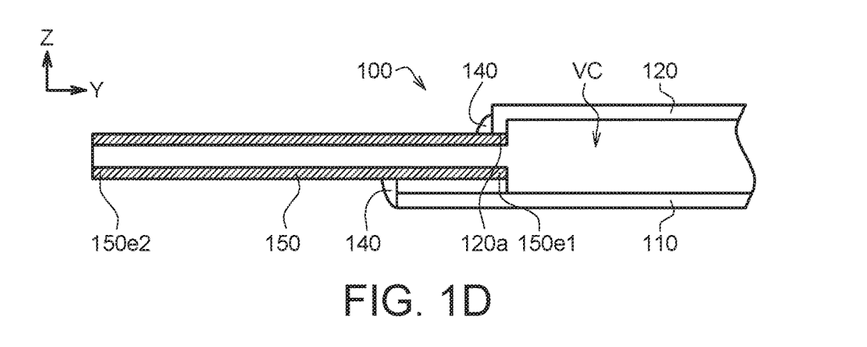
FIG. 1D illustrates a cross sectional view of the heat conduction device along a direction 1D-1D' of FIG. 1A.

FIG. 1A illustrates an appearance view of a heat conduction device 100 according to an embodiment of the invention, FIG. 1B illustrates an exploded view of the heat conduction device 100 of FIG. 1A, FIG. 1C illustrates a cross sectional view of the heat conduction device 100 along a direction 1C-1C' of FIG. 1A, and FIG. 1D illustrates a cross sectional view of the heat conduction device 100 along a direction 1D-1D' of FIG. 1A.

The heat conduction device 100 includes a first plate 110, a second plate 120, a capillary structure 130, a fixing portion 140 and a pipe 150.

The first plate 110 is connected opposite to the second plate 120. The capillary structure 130 is formed on space SP between the first plate 110 and second plate 120, wherein a region of the space SP outside the capillary structure 13 forms a vapor channel VC. The space SP may be filled with a working fluid (not illustrated). A first terminal 100e1 (illustrated in FIG. 1A) of the heat conduction device 100 may serve as one of an evaporating end and a condensing end, and a second terminal 100e2 (illustrated in FIG. 1A) of the heat conduction device 100 may serve as another of the evaporating end and the condensing end. The heat outside the heat conduction device 100 may be absorbed by the working fluid in the evaporating end and then be vaporized into vapor. The vapor flows toward the condensing end through the vapor channel VC. The vapor in the condensing end may be condensed into liquid, and the liquid flows back the evaporating end through the capillary structure 130. Again and again, the heat conduction device 100 may dissipate heat and/or conduct heat for external environment.

In addition, the first plate 110 may be made of copper, nickel, zinc, alloys thereof or other metals with excellent thermal conductivity. The second plate 120 may be made of material similar to that of the first plate 110, and similarities is not repeated here. In addition, the first plate 110 and the second plate 120 may be flat plate whose curvature is equal to zero. In another embodiment, the first plate 110 and/or the second plate 120 also may be bent plate or curved plate whose curvature is larger than zero. In an embodiment, the first plate 110 and the second plate 120 may be curved plate, such that the heat conduction device 100 becomes a circular heat pipe or an oval-shaped heat pipe. However, as only as the first plate 110 and the second plate 120 form the space SP therebetween and connect to each other, the geometric pattern of the first plate 110 and/or the geometric pattern of the second plate 120 is not limited to the embodiment in this invention.

In the present embodiment, after the capillary structure 130 may be completed, being placed between the first plate 110 and the second plate 120. As shown in FIG. 1C, the first plate 110 has a first upper surface 110$u$, the second plate 120 has a first lower surface 120$b$ facing the first upper surface 110$u$, the capillary structure 130 has a second upper surface 130$u$, a second lower surface 130$b$ and a lateral surface 130$s$. The second upper surface 130$u$ and the second lower surface 130$b$ press against the first lower surface 120$b$ of the second plate 120 and the first upper surface 110$u$ of the first plate 110 respectively. The vapor channel VC is located at a side of the lateral surface 130$s$ of the capillary structure 130.

In terms of structure, the capillary structure 130 may include at least one of metal powders, mesh structure and grooves, and the capillary structure 130 may have a plurality of apertures. The size of the aperture of the capillary structure 130 is not limited to the embodiment in this invention. As only as a structure has capillary phenomenon, such structure can serve as the capillary structure 130 of the embodiment in this invention. The capillary structure 130 includes metal powders, such as nanometer powders. The capillary structure 130 may be formed by way of etching, laser, machining, drawing, sintering, printing and/or 3D printing, etc. In terms of material, the capillary structure 130 may be made of copper, nickel, zinc, alloys thereof or other metals with excellent thermal conductivity.

In addition, in another embodiment, the heat conduction device 100 may be formed by way of 3D printing. Under this design, at least two of the first plate 110, the second plate 120, the capillary structure 130, the fixing portion 140 and the pipe 150 may be completed by way of 3D printing, and after another or some of the first plate 110, the second plate 120, the capillary structure 130, the fixing portion 140 and the pipe 150 may be individually completed, the first plate 110, the second plate 120, the capillary structure 130, the fixing portion 140 and the pipe 150 are assembled or combined to complete the heat conduction device 100.

The fixing portion 140 is formed on a connection between the first plat 110 and the second plate 120 for fixing the first plate 110 to the second plate 120. In addition, the fixing portion 140 surrounds a peripheral of the first plate 110 and a peripheral of the second plate 120 for sealing the space SP. As a result, it can prevent the vacuum of the space SP from being broken and prevent the working fluid from leaking.

As shown in FIG. 1D, the pipe 150 has a first terminal 150$e1$ and a second terminal 150$e2$. The first terminal 150$e1$ inserts into the second plate 120 for interconnecting with the space SP, and the second terminal 150$e2$ is closed for preventing the vacuum of the space SP from being broken and preventing the working fluid from leaking. The second plate has an opening 120$a$, the first terminal 150$e1$ of the pipe 150 inserts into the opening 120$a$ of the second plate 120. In another embodiment, the opening 120$a$ may be formed on the second plate 120. In other embodiment, the opening 120$a$ may be formed on the first plate 110 and the second plate 120, and the first terminal 150$e1$ of the pipe 150 may insert into the opening 120$a$ defined by the first plate 110 and the second plate 120.

As shown in FIG. 1C, the first plate is a flat plate, that is, the first plate has no bending portion. The second plate 120 has a bending portion. For example, the second plate 120 includes an upper plate 121, a lateral plate 122 and a lower plate 123, wherein the upper plate 121 has the first lower surface 120$b$, the lateral plate 122 connects the upper plate 121 to the lower plate 123, and the lower plate 123 presses against the first upper surface 110$u$ of the first plate 110; however, the structure of the second plate 120 is not limited to the embodiment in this invention. In addition, the lower plate 123 and the first upper surface 110$u$ tightly contact to each other, and it can prevent the working fluid within the space SP from infiltrating between the lower plate 123 and the first upper surface 110$u$.

Figure 2:
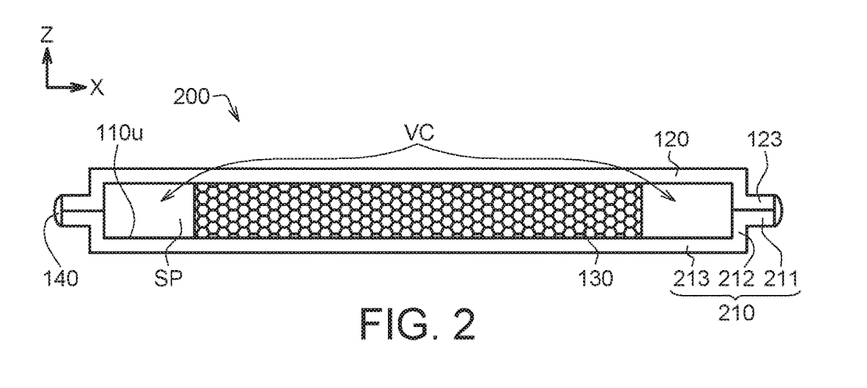
FIG. 2 illustrates a cross sectional view of a heat conduction device 200 according to another embodiment of the invention.

FIG. 2 illustrates a cross sectional view of a heat conduction device 200 according to another embodiment of the invention. The heat conduction device 200 includes a first plate 210, the second plate 120, the capillary structure 130, the fixing portion 140 and the pipe 150 (not illustrated). In the present embodiment, the first plate 210 includes an upper plate 211, a lateral plate 212 and a lower plate 213, wherein the lower plate 213 has the first upper surface 110$u$, the lateral plate 212 connects the upper plate 211 to the lower plate 213, and the upper plate 211 presses against the lower plate 123 of the second plate 120. The lower plate 123 of the second plate 120 and the upper plate 211 of the first plate 220 tightly contact to each other, and it can prevent the working fluid within the space SP from infiltrating between the lower plate 123 and the upper plate 211.

In comparison to the heat conduction device 100 of FIG. 1C, the space between the lower plate 213 and the lateral plate 212 of the first plate 210 of the heat conduction device 200 provides additional vapor channel VC, and accordingly the heat conduction device 200 can provide different property from the heat conduction device 100.

As described above, the geometric pattern of the first plate and/or the geometric pattern of the second plate can depend on the property of the heat conduction device and is not limited to the embodiment in this invention.

Figure 3A:
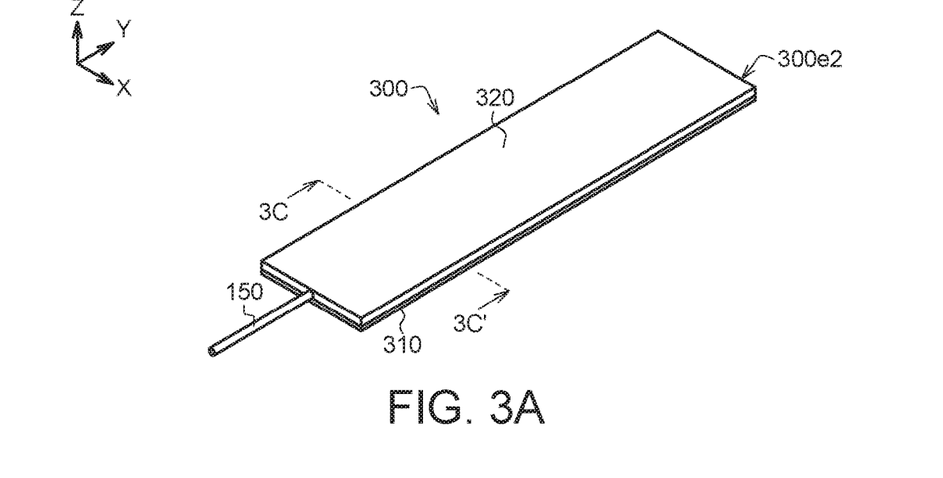
FIG. 3A illustrates an appearance view of a heat conduction device according to another embodiment of the invention.
Figure 3B:
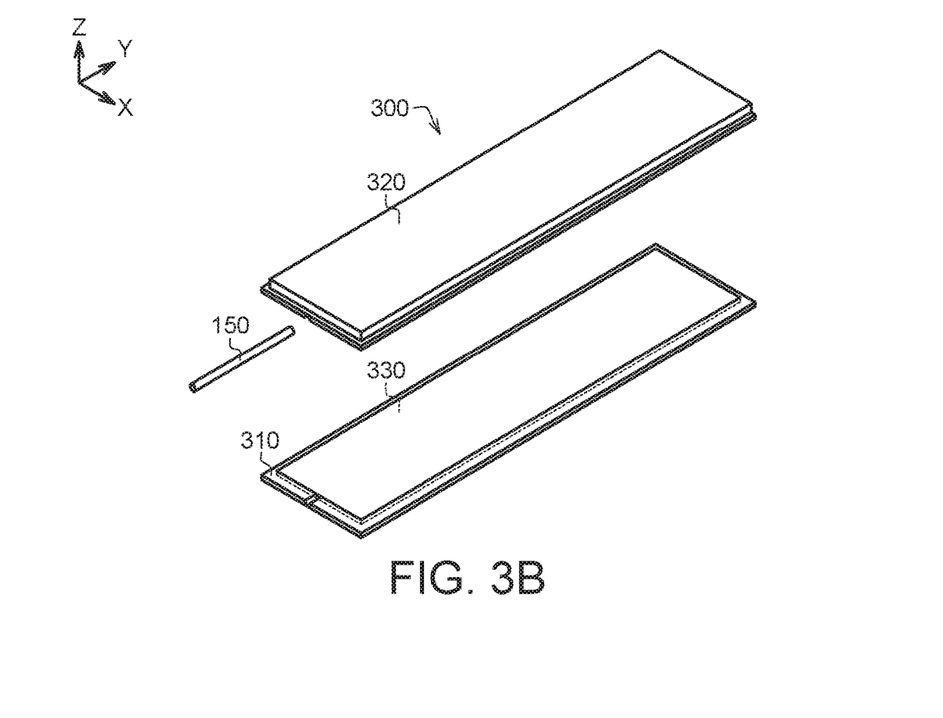
FIG. 3B illustrates an exploded view of the heat conduction device of FIG. 3A.
Figure 3C:
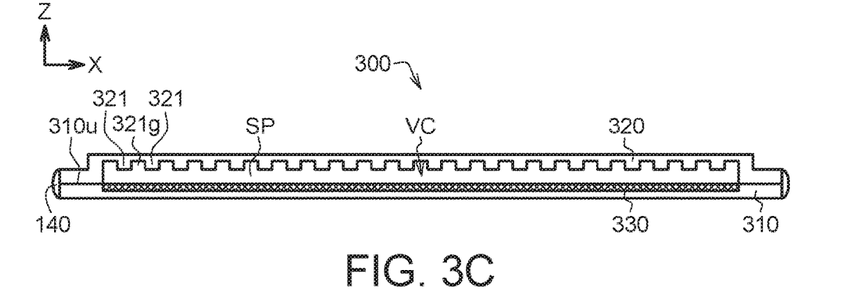
FIG. 3C illustrates a cross sectional view of the heat conduction device along a direction 3C-3C' of FIG. 3A.

FIG. 3A illustrates an appearance view of a heat conduction device 300 according to another embodiment of the invention, FIG. 3B illustrates an exploded view of the heat conduction device 300 of FIG. 3A, and FIG. 3C illustrates a cross sectional view of the heat conduction device 300 along a direction 3C-3C' of FIG. 3A.

The heat conduction device 300 includes a first plate 310, a second plate 320, a capillary structure 330, the fixing portion 140 and the pipe 150.

The first plate 310 and the second plate 320 are connected opposite to each other. The first plate 310 has a first upper surface 310$u$, and the capillary structure 330 is formed below the first upper surface 310$u$ of the first plate 310, that is, the capillary structure 330 is embedded in the first plate 310. In another embodiment, a portion of the capillary structure 330 is embedded in the first plate 310, and another portion of the capillary structure 330 is projected from the first upper surface 310u, that is, the capillary structure 330 may be not entirely embedded in the first plate 310. In another embodiment, at least a portion of the capillary structure 330 may embedded in the second plate 320.

The space SP is formed between the first plate 310 and the second plate 320. The second plate 320 includes a plurality of second protrusion 321, the space SP between the terminal surfaces of the second protrusion 321 and the first plate 310 forms the vapor channel VC. A second groove 321g is formed between the adjacent two second protrusions 321, wherein the second grooves 321g may form the capillary structure. In another embodiment, the second protrusion 321 may be omitted; under the circumstances, the second grooves 321g are omitted.

In another embodiment, the heat conduction device 300 of FIG. 3C may omit the capillary structure 330, and the capillary structure 130 of FIG. 2 may be formed between the second protrusions 321 and the first plate 310, wherein the capillary structure 130 may press against the second protrusions 321 and the first plate 310.

In other embodiment, the heat conduction device 300 of FIG. 3C may further include, for example, the capillary structure 130 of FIG. 1C, the disposition of the capillary structure 130 may be similar to that of the capillary structure 130 of FIG. 1C, and the similarity is not repeated here.

In the present embodiment, the capillary structure 130 may be shaped as strip shape, mesh shape, granular shape and/or irregular shape by way of etching, laser, machining, drawing, sintering, printing and/or 3D printing, etc.

Figure 3D:
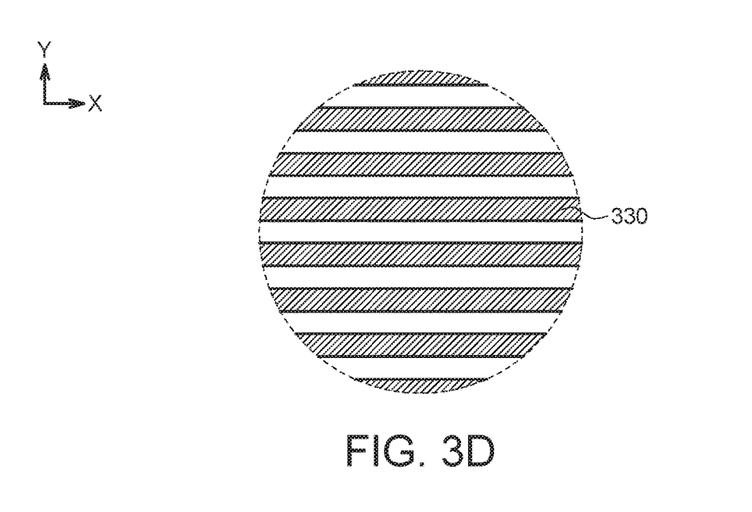
FIGS. 3D to 3F illustrate various patterns of the capillary structure of FIG. 3B.
Figure 3E:
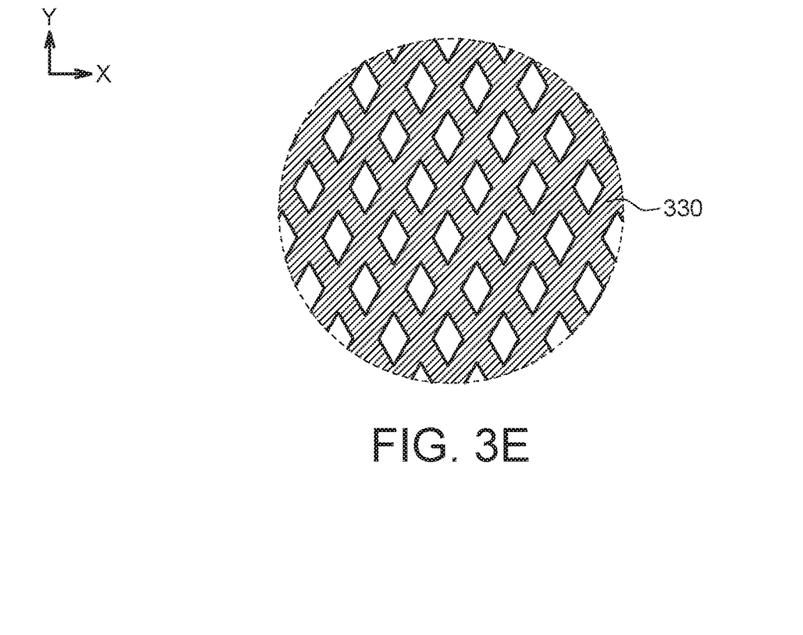
Figure 3F:
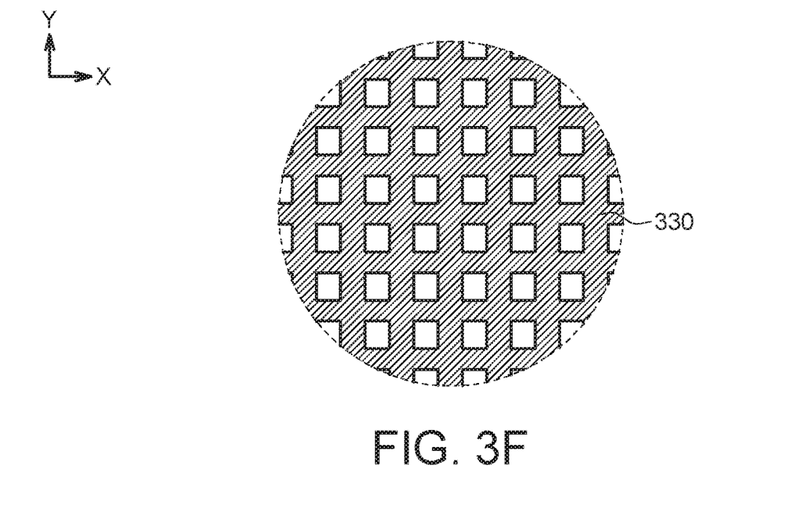

For example, FIGS. 3D to 3F illustrate various patterns of the capillary structure 330 of FIG. 3B. The cross section shown in figure represents recess, such as groove. As shown in FIG. 3D, the grooves of the capillary structure 330 are shaped as strip shapes which extends in X axis. In another embodiment, the grooves of the capillary structure 330 of FIG. 3D may be shaped as strip shapes which extend in Y axis. As shown in FIG. 3E, the grooves of the capillary structure 330 are shaped as mesh shapes, and grooves are slantwise Interweaved with each other in X axis and Y axis. As shown in FIG. 3F, the grooves of the capillary structure 330 are shaped as mesh shapes, and grooves are vertical to X axis and Y axis.

Figure 4:
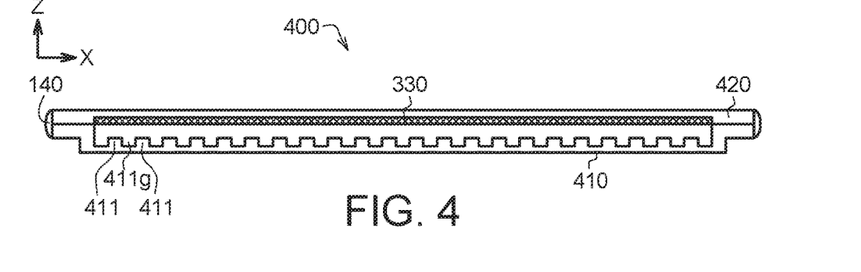
FIG. 4 illustrates a cross sectional view of a heat conduction device according to another embodiment of the invention.

FIG. 4 illustrates a cross sectional view of a heat conduction device 400 according to another embodiment of the invention. The heat conduction device 400 includes a first plate 410, a second plate 420, the capillary structure 330, the fixing portion 140 and the pipe 150 (not illustrated).

The first plate 410 and the second plate 420 are connected opposite to each other. The first plate 410 has a first lower surface 410b, and the capillary structure 330 is formed above the first lower surface 420b of the second plate 420, that is, the capillary structure 330 is embedded in the second plate 420. In another embodiment, a portion of the capillary structure 330 is embedded in the second plate 420, and another portion of the capillary structure 330 is projected from the first lower surface 420b.

The space SP is formed between the first plate 410 and the second plate 420. The first plate 410 includes a plurality of first protrusion 411, the space SP between the terminal surfaces of the first protrusion 411 and the second plate 420 forms the vapor channel VC. A first groove 411g is formed between the adjacent two first protrusions 411, wherein the first groove 411g may form the capillary structure. In another embodiment, the first protrusions 411 may be omitted; under the circumstances, the first grooves 411g are omitted.

In another embodiment, the heat conduction device 400 of FIG. 4 may omit the capillary structure 330, and the capillary structure 130 of FIG. 2 may be formed between the first protrusions 411 and the second plate 420, wherein the capillary structure 130 may press against the first protrusions 411 and the second plate 420.

In other embodiment, the heat conduction device 400 of FIG. 4 may further include, for example, the capillary structure 130 of FIG. 1C, the disposition of the capillary structure 130 may be similar to that of the capillary structure 130 of FIG. 1C, and the similarity is not repeated here.

In an embodiment, the first plate 410 of FIG. 4 may omit the first protrusions 411, and the heat conduction device 400 of FIG. 4 may further include the capillary structure 330 of FIG. 3C, wherein the capillary structure 330 may be embedded in the first plate 410. Under such design, the heat conduction device 400 includes two capillary structures 330 opposite to each other, wherein the vapor channel VC is formed between two capillary structures 330.

In another embodiment, the first plate 410 of FIG. 4 may omit the first protrusions 411, and the heat conduction device 400 of FIG. 4 may further include the capillary structure 330 of FIG. 3C and the capillary structure 130 of FIG. 1C, wherein the capillary structure 330 may be embedded in the first plate 410, and the capillary structure 130 may be disposed between two capillary structures 330 opposite to each other and presses against at least one of two capillary structures 330. Under such design, the heat conduction device 400 includes two capillary structures 330 opposite to each other, wherein the capillary structure 130 is located between two capillary structures 330, and the vapor channel VC is formed on a side or two sides of capillary structure 130.

Figure 5:
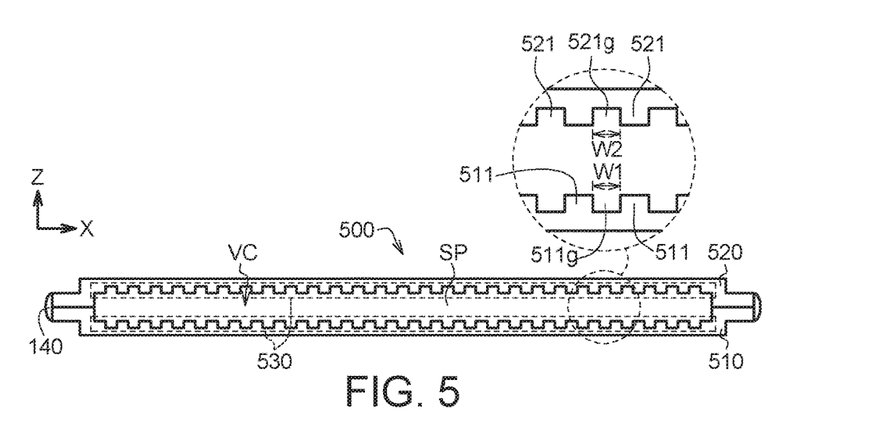
FIG. 5 illustrates a cross sectional view of a heat conduction device according to another embodiment of the invention.

FIG. 5 illustrates a cross sectional view of a heat conduction device 500 according to another embodiment of the invention. The heat conduction device 500 includes a first plate 510, a second plate 520, a capillary structure 530, the fixing portion 140 and the pipe 150 (not illustrated).

In the present embodiment, the first plate 510 includes a plurality of first protrusion 511, and a first groove 511g is formed between the adjacent two first protrusions 511. The second plate 520 includes a plurality of second protrusion 521, and a second groove 521g is formed between the adjacent two second protrusions 521. The first protrusions 511, the first grooves 511g, the second protrusions 521 and the second grooves 521g together form the capillary structure 530. The vapor channel VC is formed between the terminal surfaces of the first protrusions 511 and the terminal surfaces of the second protrusions 521. In the present embodiment, a width W1 of each first groove 511g and/or a width W2 of each second groove 521g ranges between 0.05 millimeters and 0.2 millimeters, less than 0.05 millimeters or larger than 0.2 millimeters. The width of the groove of the capillary structure herein may range between 0.05 millimeters and 0.2 millimeters, less than 0.05 millimeters or larger than 0.2 millimeters.

In another embodiment, the first plate 510 may omit the first protrusions 511, or the second plate 520 may omit the second protrusions 521.

Figure 6:
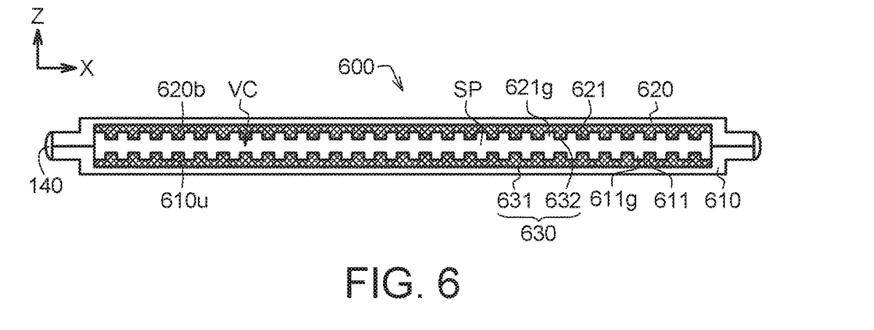
FIG. 6 illustrates a cross sectional view of a heat conduction device according to another embodiment of the invention.

FIG. 6 illustrates a cross sectional view of a heat conduction device 600 according to another embodiment of the invention. The heat conduction device 600 includes a first plate 610, a second plate 620, a capillary structure 630, the fixing portion 140 and the pipe 150 (not illustrated).

In the present embodiment, the capillary structure 630 may be formed on a first upper surface 610u of the first plate 610 and a first lower surface 620b of the second plate 620.

The capillary structure 630 may be formed on the first plate 610 and the second plate 620 by way of sintering, printing and/or 3D printing, etc., and then the grooves, as shown in FIGS. 3D to 3F, may be formed by way of etching, laser, machining, drawing, etc.

The capillary structure 630 includes a first capillary structure 631 and a second capillary structure 632, wherein the first capillary structure 631 and the second capillary structure 632 are formed on the first upper surface 610u and the first lower surface 620b. The first capillary structure 631 includes a plurality of first protrusions 611, and a first groove 611g is formed between the adjacent two first protrusions 611. The second capillary structure 632 includes a plurality of second protrusions 621, and a second groove 621g is formed between the adjacent two second protrusions 621.

Figure 7:
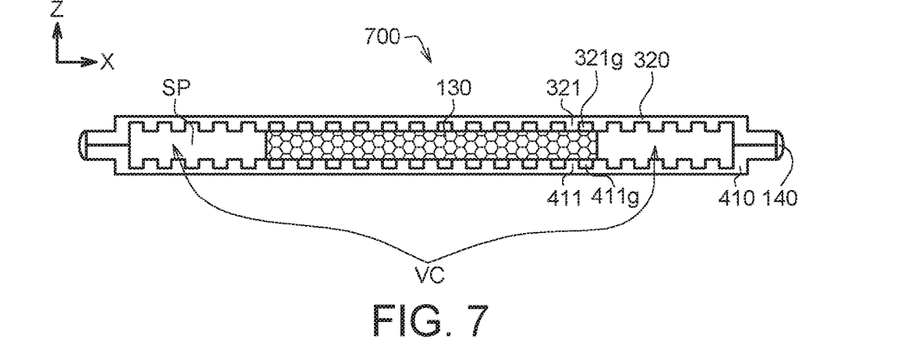
FIG. 7 illustrates a cross sectional view of a heat conduction device according to another embodiment of the invention.

FIG. 7 illustrates a cross sectional view of a heat conduction device 700 according to another embodiment of the invention. The heat conduction device 700 includes the first plate 410, the second plate 320, the capillary structure 130, the fixing portion 140 and the pipe 150 (not illustrated).

The first plate 410 includes a plurality of the first protrusion 411, and a plurality of the first groove 411g are formed among a plurality of the first protrusions 411. The second plate 320 includes a plurality of the second protrusions 321, and a plurality of the second groove 321g are formed among a plurality of the second protrusions 321. The capillary structure 130 may be formed on the space SP between the first plate 410 and the second plate 320, wherein a region of the space SP outside the capillary structure 130 forms the vapor channel VC. The capillary structure 130 is disposed between the first protrusions 411 and the second protrusions 321 and presses against the terminal surfaces of the first protrusions 411 and the terminal surfaces of the second protrusion 321. In the present embodiment, the capillary structure 130 is located at a central region of the space SP, and the vapor channel VC is located at two sides of the space SP. In another embodiment, the capillary structure 130 may be located at two sides of the space SP, and the vapor channel VC is located at a central region of the space SP. In other embodiment, the capillary structure 130 may be located at a region or a side of the space SP, and vapor channel VC may be located at another region or another side of the space SP.

The heat conduction device may extend in a straight direction; however, such exemplification is not meant to be for limiting however.

Figure 8:
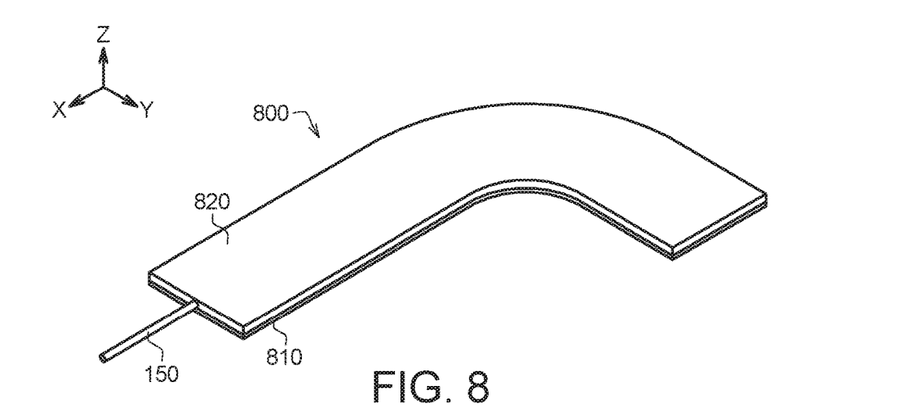
FIGS. 8 and 9 illustrate appearance views of a heat conduction device according to another embodiment of the invention.
Figure 9:
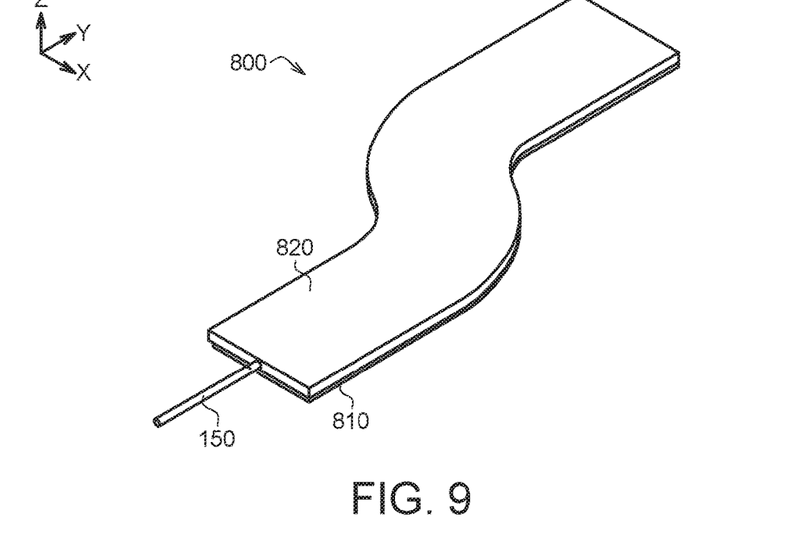

FIGS. 8 and 9 illustrate appearance views of a heat conduction device 800 according to another embodiment of the invention. The heat conduction device 800 includes a first plate 810, a second plate 820, the capillary structure (not illustrated), the fixing portion 140 (not illustrated) and the pipe 150 (not illustrated). The interior structure of the heat conduction device 800 is similar to that of anyone of the heat conduction device 100 to 700.

In the present embodiment, the heat conduction device 800 may extend in a plane, for example, XY plane. For example, the heat conduction device 800 may extend as an L-shape (as shown in FIG. 8), U shape, M shape, S shape (as shown in FIG. 9), etc. In another embodiment, the heat conduction device 800 may extend in a straight direction, a curved direction or a combination thereof in the same plane.

Figure 10:
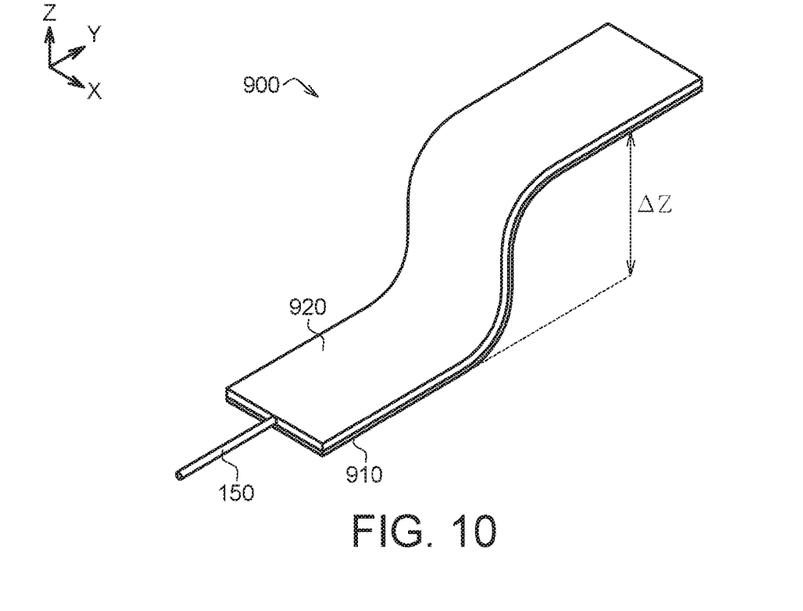
FIG. 10 illustrates an appearance view of a heat conduction device according to another embodiment of the invention.

FIG. 10 illustrates an appearance view of a heat conduction device 900 according to another embodiment of the invention. The heat conduction device 900 includes a first plate 910, a second plate 920, the capillary structure (not illustrated), the fixing portion 140 (not illustrated) and the pipe 150 (not illustrated). The interior structure of the heat conduction device 900 is similar to that of anyone of the heat conduction device 100 to 700.

In the present embodiment, the heat conduction device 900 may extend in two planes having level difference. For example, a portion of the heat conduction device 900 extends in a first XY plane, and another portion of the heat conduction device 900 extends in a second XY plane, wherein the level difference between the first XY plane and the second XY plane is in Z axis, that is, the heat conduction device 900 has a height difference in Z axis. In another embodiment, the shape of the heat conduction device 900 may extend in more than two planes having level differences.

FIGS. 11A to 11E illustrate manufacturing processes of the heat conduction device 100 of FIG. 1A.

Figure 11A:
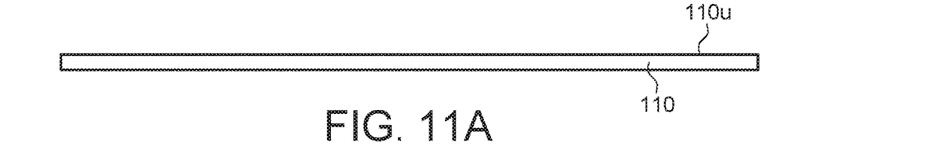
FIGS. 11A to 11E illustrate manufacturing processes of the heat conduction device of FIG. 1A.

As shown in FIG. 11A, the first plate 110 is provided, wherein the first plate 110 has the first upper surface 110u. The first plate 110 is, for example, metal piece, and formed by way of stamping, laser cutting, machining cutting and/or bending, etc.

Figure 11B:
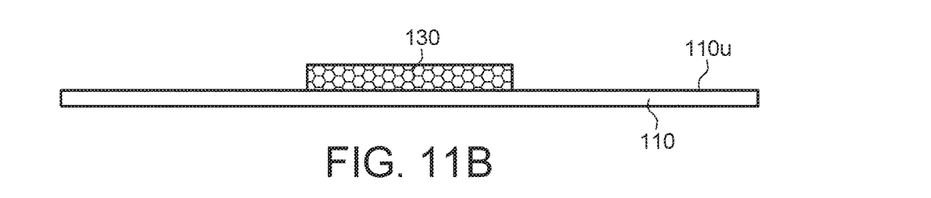

As shown in FIG. 1B, the capillary structure 130 is formed on the first upper surface 110u of the first plate 110. Before the capillary structure 130 is formed, the first plate 110 may be cleaned to remove particles and oil sludge (if any).

In the present embodiment, after the capillary structure 130 is completed, being disposed on the first plate 110. In terms of structure, the capillary structure 130 may include at least one of metal powders, mesh structure and grooves, and capillary structure 13 has a plurality of apertures. The size of the aperture of the capillary structure 130 is not limited to the embodiment in this invention. As only as a structure has capillary phenomenon, the structure can serve as the capillary structure 130 of the embodiment in this invention.

The forming method of metal powder includes the following steps. Firstly, metal powders are evenly mixed with a variety of organic and inorganic chemicals to form a metal paste mixture; then, the metal paste mixture is evenly formed on the first surface 110u of the first plate 110 by way of screen printing. Then, sintering is performed on the metal paste mixture for about 4 hours to about 6 hours at about 900 degrees Celsius to about 950 degrees Celsius.

In another embodiment, the capillary structure 130 may be formed by way of 3D printing. In another embodiment, the first plate 110 and the capillary structure 130 may be together formed by way of 3D printing. The 3D printing process includes: the design figure and laser temperature for melting metal, etc. are input; then, the box containing metal first prints from the inside to the outside longitudinally, wherein the metal powders are sprinkled on surface of the plate disposed on the printing machine from the bottom of the box. After the metal powders are melted by laser, another metal powder layer is sprinkled by the box from the inside to the outside, and then the box returns the square one. So repeatedly, until the completion of printing the capillary structure.

Figure 11C:
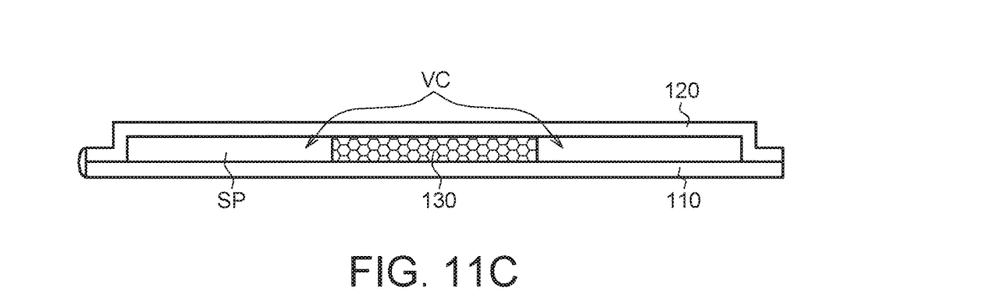

As shown in FIG. 11C, the first plate is connected opposite to the second plate 120, wherein the capillary structure 130 is located at the space SP between the first plate 110 and the second plate 120, and the region of the space SP outside the capillary structure 130 forms the vapor channel VC. In addition, the second plate 120 has the opening 120a (shown in FIG. 11D), wherein the opening 120a may be formed on a short edge of the second plate 120. In another embodiment, the opening 120a may be formed on the first plate 110, or on the first plate 110 and the second plate 120a. The second plate 120 is, for example, metal piece, and the forming method thereof is similar to that of the first plate 110. In addition, before the first plate 110 is connected opposite to the second plate 120, the second plate 120 may be cleaned to remove particles and oil sludge (if any) on the surface of the second plate 120.

Figure 11D:
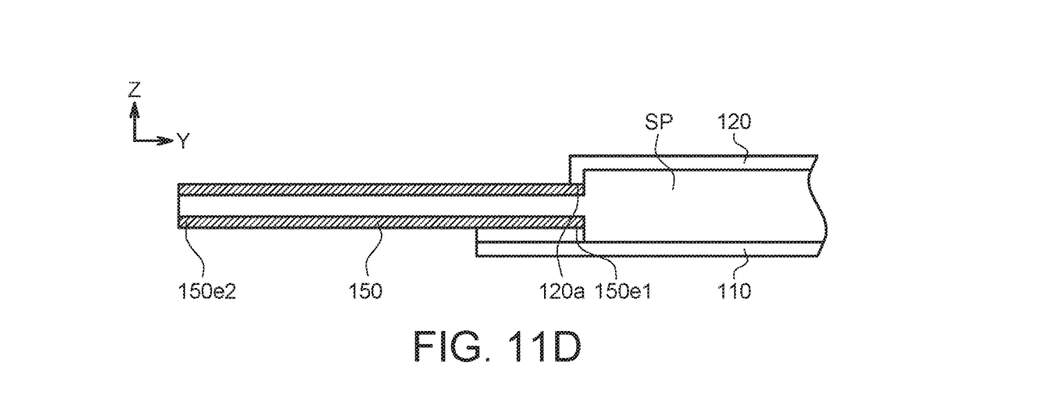

As shown in FIG. 11D, the pipe 150 is provided, wherein the pipe 150 has the first terminal 150e1 and the second terminal 150e2. Then, the first terminal 150e1 inserts into the opening 120a of the second plate 120 for interconnected with the space SP.

Figure 11E:
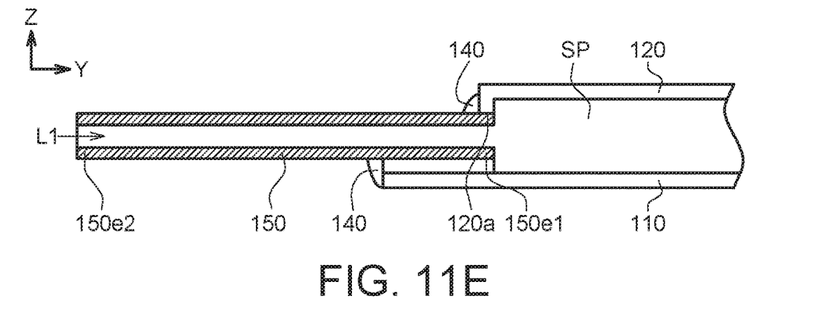

As shown in FIG. 11E, the fixing portion 140, as shown in FIGS. 1C and 1D, is formed on the connection between the first plate 110 and the second plate 120, for fixing the first plate 110 to the second plate 120, to form a flat plate-shaped heat conduction structure. The fixing portion 140 may be formed by way of welding, Ion electric welding, laser welding, ultrasonic welding or other suitable technique. The fixing portion 140 surrounds the periphery of the first plate 110 and the periphery of the second plate 120 for sealing the space SP.

Then, the flat plate-shaped heat conduction structure is placed on an annealing furnace to be annealed for removing oxide layer generated on the preceding process and/or eliminate the stress. The annealing process includes: before the furnace temperature reaches about 600 degrees Celsius, the annealing furnace is filled with nitrogen gas for 40 minutes to 45 minutes; then, the furnace temperature reaches about 600 degrees Celsius to about 750 degrees Celsius, the annealing furnace is filled with the mixture of nitrogen gas and hydrogen gas for 40 minutes to 45 minutes; then, the furnace temperature is cooled to room temperature, and simultaneously the annealing furnace is filled with nitrogen gas.

Then, as shown in FIG. 11E, the working fluid is injected to the space SP of the flat plate-shaped heat conduction structure through the pipe 150, and then the space SP is vacuumed to be in a vacuum state by using a negative pressure valve, and accordingly the content of non-condensable gases may be reduced, so that the liquid water may be vaporized at a lower temperature.

Then, the second terminal 150e2 of the pipe 150 may be closed to form the heat conduction device 100 by way of welding, Ion electric welding, laser welding, ultrasonic welding or other suitable technique. Then, the test is optionally performed on the heat conduction device 100.

As described above, the heat conduction device 100 of this embodiment may omit a stave process, and it can prevent the interior structure of the heat conduction device 100 from being broken due to the stave process. In addition, in comparison to the process of the conventional heat pipe heat, the capillary structure 130 of this embodiment is formed in opening environment, and accordingly the appearance and/or the interior structure of the capillary structure 130 may be inspected clearly and conveniently.

The manufacturing method of the heat conduction device 200 of FIG. 2 is similar to that of the heat conduction device 100, and similarities are not repeated here.

Figure 12A:
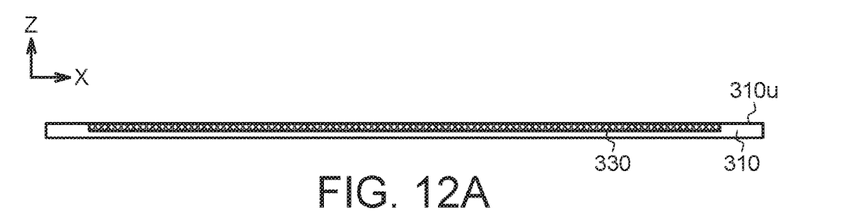
FIGS. 12A to 12B illustrates manufacturing processes of the heat conduction device of FIG. 3C.
Figure 12B:
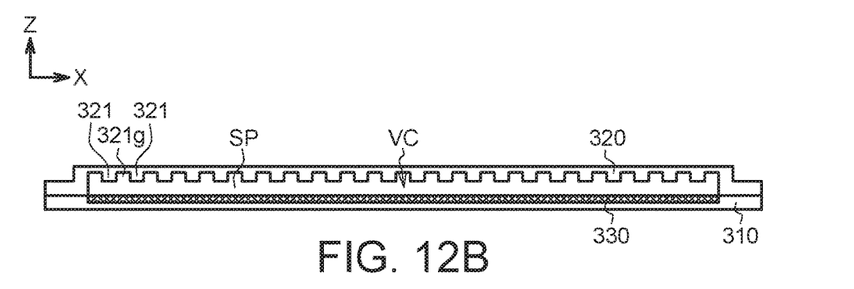

FIGS. 12A to 12B illustrates manufacturing processes of the heat conduction device 300 of FIG. 3C.

As shown in FIG. 12A, the first plate 310 is provided, wherein the first plate 310 has the first upper surface 310u.

As shown in FIG. 12A, the capillary structure 330 may be formed by way of etching, laser, machining, drawing, sintering, printing and/or 3D printing, etc., wherein the capillary structure 330 is embedded below the first upper surface 310u of the first plate 310. In another embodiment, a portion of the capillary structure 330 may be embedded below the first upper surface 310u of the first plate 310, and another portion of the capillary structure 330 may project from the first upper surface 310u of the first plate 310.

As shown in FIG. 12B, the second plate 320 is provided, and then the first plate 310 is connected opposite to the second plate 320.

The other steps of the manufacturing method of the heat conduction device 300 are similar to the corresponding steps of the heat conduction device 100, and similarities are not repeated here.

The manufacturing method of the heat conduction device 400 of FIG. 4 is similar to that of the heat conduction device 300, and similarities are not repeated here.

Figure 13A:
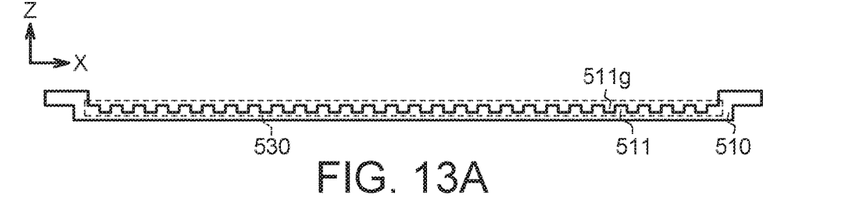
FIGS. 13A to 13B illustrate manufacturing processes of the heat conduction device of FIG. 5.
Figure 13B:
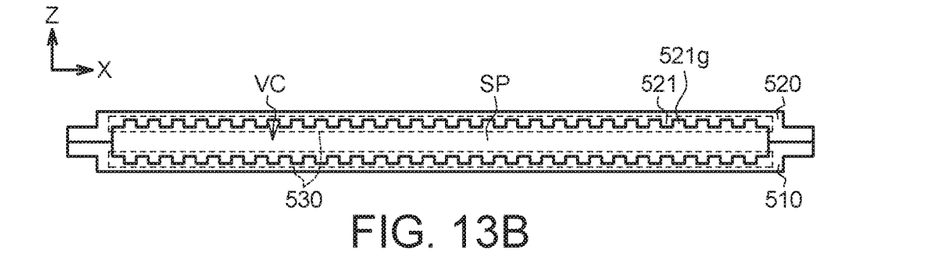

FIGS. 13A to 13B illustrate manufacturing processes of the heat conduction device 500 of FIG. 5.

As shown in FIG. 13A, the first plate 510 is provided, and then a plurality of the first protrusions 511 are formed on the first plate 510, wherein a first groove 511g is formed between the adjacent two first protrusions 511. The first grooves 511g form the capillary structure 530. The first protrusions 511 may be formed by way of etching, laser, machining, etc.

As shown in FIG. 13B, the second plate 520 is provided, and then a plurality of the second protrusions 521 are formed on the second plate 520, wherein a second groove 521g is formed between the adjacent two second protrusions 521. The second grooves 521g form the capillary structure 530. The second protrusions 521 may be formed by way similar to that of the first protrusions 511, and similarities are not repeated here.

As shown in FIG. 13B, the first plate 510 is connected to and opposite to the second plate 520, wherein the terminal surfaces of the first protrusions 511 of the first plate 510 and the terminal surfaces of the second protrusions 521 of the second plate 520 forms a vapor channel VC therebetween.

The other steps of the manufacturing method of the heat conduction device 500 are similar to the corresponding steps of the heat conduction device 100, and similarities are not repeated here.

Figure 14A:
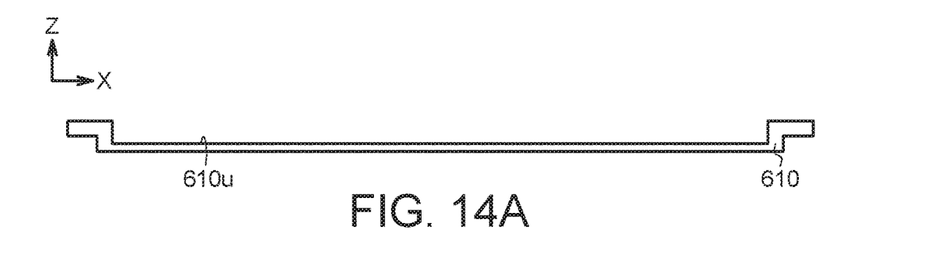
FIGS. 14A to 14C illustrate manufacturing processes of the heat conduction device of FIG. 6.
Figure 14B:
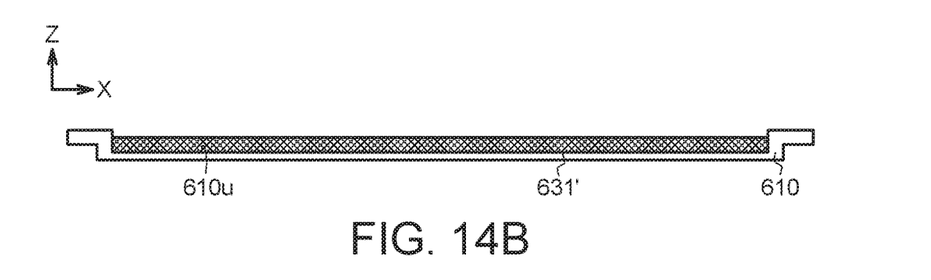
Figure 14C:
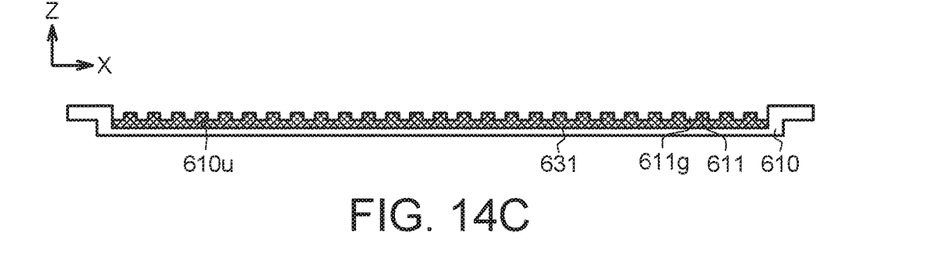

FIGS. 14A to 14C illustrate manufacturing processes of the heat conduction device 600 of FIG. 6.

As shown in FIG. 14A, the first plate 610 is provided. The material and/or forming method is similar to that of the second plate 110, and similarities are not repeated here.

As shown in FIG. 14B, a first capillary structure 631' is formed on the first upper surface 610u of the first plate 610 by way of printing and/or 3D printing, etc.

As shown in FIG. 14C, a plurality of the first protrusions 611 are formed on the first capillary structure 631' to form the first capillary structure 631 as shown in FIG. 6 by way of etching, laser, machining, drawing, etc., wherein a first groove 611g is formed between the adjacent two first protrusions 611, and the first grooves 611g are, for example, the grooves as shown in FIGS. 3D to 3F.

The forming method of the second plate 620 and the forming method of the second capillary structure 632 are similar to that of the first plate 610 and that of the first capillary structure 631 respectively, and similarities are not repeated here.

The other steps of the manufacturing method of the heat conduction device 600 are similar to the corresponding steps of the heat conduction device 100, and similarities are not repeated here.

Figure 15A:
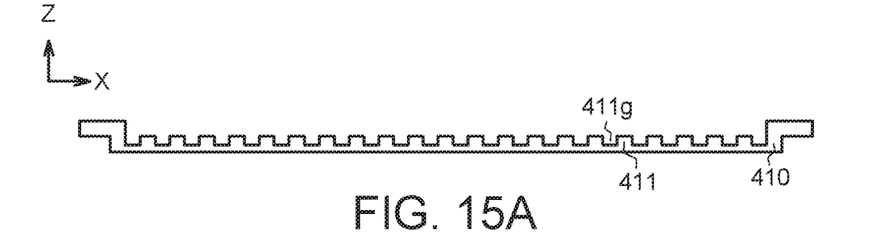
FIGS. 15A to 15C illustrate manufacturing processes of the heat conduction device of FIG. 7.
Figure 15B:
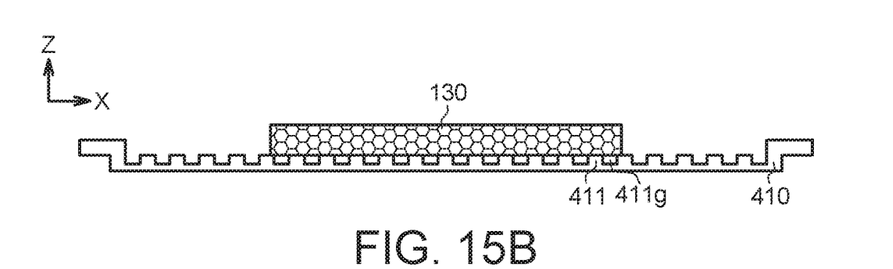
Figure 15C:
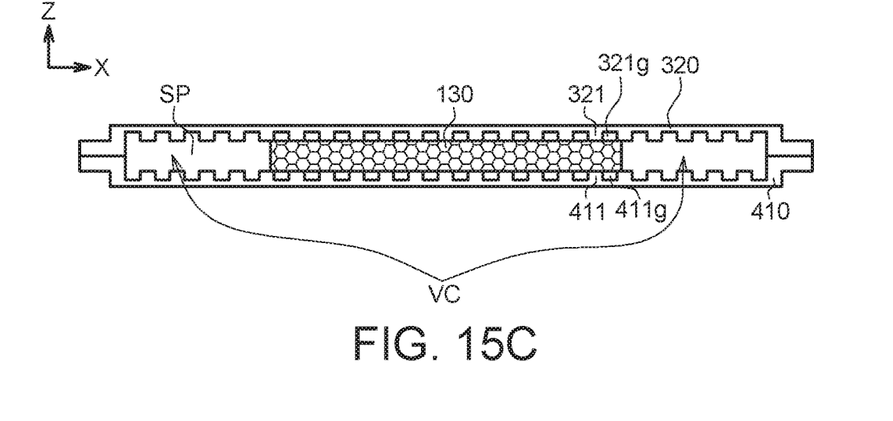

FIGS. 15A to 15C illustrate manufacturing processes of the heat conduction device 700 of FIG. 7.

As shown in FIG. 15A, the first plate 410 is provided, wherein the first plate 410 has a plurality of the first protrusions 411, a first groove 411g is formed between the adjacent two first protrusions 411, and the first grooves 411g form the capillary structure.

As shown in FIG. 15B, the capillary structure 130 is formed on the first protrusions 411 of the first plate 410 by way of etching, laser, machining, drawing, sintering, printing and/or 3D printing, etc.

As shown in FIG. 15C, the second plate 320 is provided, wherein the second plate 320 has a plurality of the second protrusions 321, a second groove 321g is formed between the adjacent two second protrusions 321, and the second grooves 321g form the capillary structure.

As shown in FIG. 15C, the first plate 410 is connected opposite to the second plate 320, wherein the capillary structure 130 is located between the terminal surfaces of the first protrusions 411 of the first plate 410 and the terminal surfaces of the second protrusions 321 of the second plate 320, and presses against the terminal surfaces of the first protrusions 411 of the first plate 410 and the terminal surfaces of the second protrusions 321 of the second plate 320.

The other steps (for example, the forming step of the fixing portion and the inserting step of the pipe) of the manufacturing method of the heat conduction device 700 are similar to the corresponding steps of the heat conduction device 100, and similarities are not repeated here.

As described above, the first plate and the second plate of the heat conduction device of this invention may extend in the same plane or different height panes to be shaped as various shapes, such that the heat conduction device becomes 2D structure or 3D structure. In addition, the first plate and/or the second plate may be a flat plate whose curvature is equal zero, or be a bent plate or a curved plate whose curvature is unequal to zero. As only as the first plate and the second plate form the space therebetween and connect to each other, the structure of the first plate 110 and/or the structure of the second plate 120 is not limited to the embodiment in this invention.

In an embodiment, the capillary structure may be directly formed on the plate (for example, the first plate and/or the second plate) by way of etching, laser, machining, drawing, sintering, printing and/or 3D printing, etc. In another embodiment, the capillary structure may be individually formed by way of etching, laser, machining, drawing, sintering, printing and/or 3D printing, etc., and then disposed between two plates. The forming method of the capillary structure of the same heat conduction device is not limited to one method. For example, the capillary structure may be formed by way of at least two of etching, laser, machining, drawing, sintering, printing and/or 3D printing, etc. In an embodiment, the capillary structure may be formed on the plate by way of printing or 3D printing, sintering and etching in order.

In an embodiment, the capillary structure may be the groove between two protrusions in anyone of the plates; under such design, the capillary structure and the plate are integrated into one piece. In another embodiment, the capillary structure may be layer structure formed on a surface of the plate and/or at least a portion of the capillary structure may be embedded under the surface; under such design, the capillary structure and the plate are two individual and different components. The capillary structure of the same heat conduction device may include groove and layer structure. In addition, the vapor channel may be located at any side, several sides, the upper surface and/or the lower surface of the capillary structure. Alternatively, the vapor channel may be located at the space between the capillary structure and a surface of any plate.

The heat conduction device of this embodiment may omit a stave process, and it can prevent the heat conduction device 100 from being broken due to the stave process. In addition, in comparison to the process of the conventional heat pipe heat, the capillary structure of this embodiment is formed in opening environment, and accordingly the appearance and/or interior structure of the capillary structure may be inspected clearly and conveniently. In addition, the plate has a thin thickness, such that the heat conduction device has a thickness ranging between 0.2 millimeters and 2.0 millimeters, less than 0.2 millimeters, or larger than 2.0 millimeters. In comparison to the conventional staved heat pipe heat, the heat conduction device of the embodiment has a thinner thickness. In addition, the thin heat conduction device of the embodiment may be applied to handheld electronic products, such as cell phone, notebook, etc., or the products which has a need to dissipate heat, such as appliances, vehicles, internal combustion engines, power plants, etc.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A heat conduction device, comprising:
a first plate;
a second plate connected opposite to the first plate; and
a capillary structure formed in a space between the first plate and the second plate;
wherein a vapor channel is formed on a region of the space outside the capillary structure,
wherein the first plate has a first upper surface, the second plate has a first lower surface facing the first upper surface, the capillary structure has a second upper surface, a second lower surface and a lateral surface, the second upper surface and the second lower surface press against the first lower surface and the first upper surface respectively, and the vapor channel is located at a side of the lateral surface of the capillary structure.

2. The heat conduction device according to claim 1, further comprising:
a fixing portion formed on a connection between the first plate and the second plate for fixing the first plate to the second plate.

3. The heat conduction device according to claim 2, wherein the fixing portion surrounds a periphery of the first plate and a periphery of the second plate for sealing the space.

4. The heat conduction device according to claim 1, further comprising:
a pipe having a first terminal and a second terminal, wherein the first terminal inserts into at least one of the first plate and the second plate for interconnecting the space, and the second terminal is closed.

5. The heat conduction device according to claim 1, wherein the capillary structure includes at least one of a metal powder, a mesh structure and a groove.

6. A heat conduction device, comprising:
a first plate;
a second plate connected opposite to the first plate; and
a capillary structure formed in a space between the first plate and the second plate;

wherein a vapor channel is formed on a region of the space outside the capillary structure, and wherein the first plate comprises a plurality of first protrusions, a plurality of first grooves is formed among the first protrusions, the first grooves form the capillary structure, and the vapor channel is formed between the first protrusions and the second plate.

7. A heat conduction device, comprising:
a first plate;
a second plate connected opposite to the first plate; and
a capillary structure formed in a space between the first plate and the second plate;
wherein a vapor channel is formed on a region of the space outside the capillary structure, and
wherein the first plate comprises a plurality of first protrusions, a plurality of first grooves is formed among the first protrusions, and the capillary structure press against the first protrusions and the second plate.

8. A manufacturing method of a heat conduction device, comprising:
providing a first plate;
providing a second plate;
forming a capillary structure on at least one of the first plate and the second plate; and
connecting the first plate and the second plate, wherein the capillary structure is formed in a space between the first plate and the second plate, and a vapor channel is formed on a region of the space outside the capillary structure,
wherein the first plate has a first upper surface, the second plate has a first lower surface facing the first upper surface, the capillary structure has a second upper surface, a second lower surface and a lateral surface,
wherein the step of forming the capillary structure on the at least one of the first plate and the second plate comprises:
providing the capillary structure; and
placing the capillary structure on the first plate or the second plate;
wherein in the step of connecting the first plate and the second plate, the second upper surface and the second lower surface press against the first lower surface and the first upper surface respectively, and the vapor channel is located at a side of the lateral surface of the capillary structure.

9. The manufacturing method according to claim 8, further comprising:
forming a fixing portion on a connection between the first plate and the second plate for fixing the first plate to the second plate.

10. The manufacturing method according to claim 8, wherein in the step of forming the fixing portion on the connection between the first plate and the second plate, the fixing portion surrounds a periphery of the first plate and a periphery of the second plate for sealing the space.

11. The manufacturing method according to claim 8, further comprising:
providing a pipe having a first terminal and a second terminal;
inserting the first terminal into at least one of the first plate and the second plate for interconnecting the space; and
closing the second terminal.

12. The manufacturing method according to claim 8, wherein the capillary structure includes at least one of a metal powder, a mesh structure and a groove.

13. A manufacturing method of a heat conduction device, comprising:
providing a first plate;
providing a second plate;
forming a capillary structure on at least one of the first plate and the second plate; and
connecting the first plate and the second plate, wherein the capillary structure is formed in a space between the first plate and the second plate, and a vapor channel is formed on a region of the space outside the capillary structure,
wherein the step of providing the first plate comprises:
forming a plurality of first protrusions on the first plate, wherein a plurality of first grooves is formed among the first protrusions, and the first grooves form the capillary structure;
wherein in the step of connecting the first plate and the second plate, the vapor channel is formed between the first protrusions and the second plate.

14. A manufacturing method of a conduction device, comprising:
providing a first plate;
providing a second plate;
forming a capillary structure on at least one of the first plate and the second plate; and
connecting the first plate and the second plate, wherein the capillary structure is formed in a space between the first plate and the second plate, and a vapor channel is formed on a region of the space outside the capillary structure,
wherein the step of providing the first plate comprises:
forming a plurality of first protrusions on the first plate, wherein a plurality of first grooves is formed among the first protrusions, and the capillary structure presses against the first protrusions and the second plate.

15. The heat conduction device according to claim 7, wherein at least a portion of the capillary structure is embedded in the second plate.

16. The manufacturing method according to claim 14, wherein in the step of forming the capillary structure on the at least one of the first plate and the second plate, at least a portion of the capillary structure is embedded in the second plate.

* * * * *